United States Patent [19]

Mensch, Jr.

[11] 3,942,037
[45] Mar. 2, 1976

[54] MOS EDGE SENSING CIRCUIT
[75] Inventor: William David Mensch, Jr., Mesa, Ariz.
[73] Assignee: Motorola, Inc., Chicago, Ill.
[22] Filed: Sept. 6, 1974
[21] Appl. No.: 503,993

[52] U.S. Cl. .............. 307/232; 307/205; 307/236; 307/269
[51] Int. Cl.² H03K 5/153; H03K 5/13; H03K 5/34; H03K 5/36
[58] Field of Search .......... 307/231, 232, 236, 205, 307/215, 269; 328/114, 132

[56] References Cited
UNITED STATES PATENTS

| 3,430,148 | 2/1969 | Miki | 307/232 X |
| 3,474,414 | 10/1969 | Lenz | 307/232 X |
| 3,610,954 | 10/1971 | Treadway | 307/232 |
| 3,678,295 | 7/1972 | Heneghan | 307/232 X |
| 3,860,832 | 1/1975 | Aaprd | 307/232 |

Primary Examiner—Stanley D. Miller, Jr.
Assistant Examiner—L. N. Anagnos
Attorney, Agent, or Firm—Harry M. Weiss; Charles R. Hoffman

[57] ABSTRACT

An edge sensing circuit is implemented using MOS logic gates. The edge sense circuit detects either a positive transition or a negative transition of a first input signal, depending on the logic level of a second input signal, if an enable signal logical "1" is applied to the edge sense circuit. If the enable signal is at a logical "0," however, a level, rather than a transition, of the input signal is detected.

10 Claims, 7 Drawing Figures

MOS EDGE SENSING CIRCUIT

BACKGROUND OF THE INVENTION

In certain electronic applications circuits have been utilized which sense a transition of a logic signal. A wide variety of bipolar and MOS circuits which accomplish sensing of a particular positive or negative transition, are know in the art. Some known edge sensing circuits detect positive transitions of an input signal, while others detect negative transitions thereof. Further, a wide variety of known logic circuits are utilized in the art which utilize capacitance circuitry to accomplish an edge sensing. Further, a wide variety of known logic circuits are capable of sensing either a positive or a negative logic level.

SUMMARY OF THE INVENTION

It is an object of this invention to provide an improved edge sensing circuit.

It is another object of this invention to provide an edge sensing circuit which detects a transition of predetermined polarity of an input signal conditioned upon the voltage level of the second input signal.

It is another object of this invention to provide a circuit which senses either an edge or a corresponding logic level of a first input signal depending upon the logic level of a second input signal.

Briefly described, the invention is a bit sensing circuit including flip-flop circuit means coupled to gating circuitry and output circuitry for storing a level indicating that a transition of predetermined polarity of an input signal has occurred. The gating circuitry includes gating circuitry coupled to input signal which controls whether a positive or negative transition of the first input signal is to be detected. Additional gating circuitry is included which determines whether the transition of the first input signal sent or whether the voltage level at the end of the transition is sent. The bit sensing surface is implemented using MOS circuitry.

DESCRIPTION OF THE INVENTION

Figure 1:
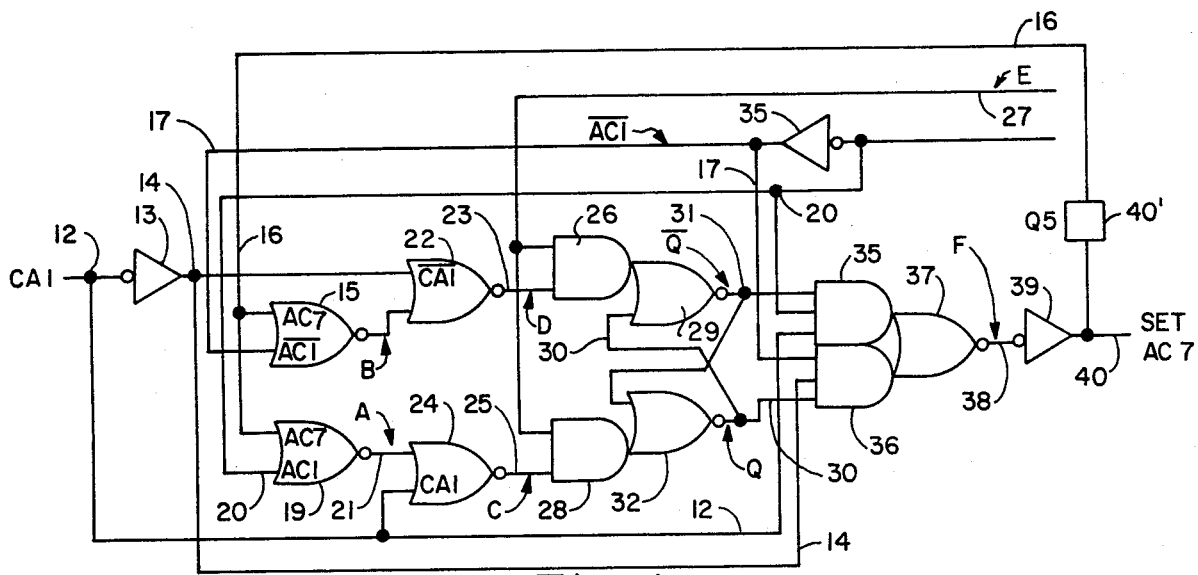
FIG. 1 is a logic diagram of a preferred embodiment of the invention.

Referring to FIG. 1, edge sensing circuit 10 includes output node 40 and input nodes 12, 20, 16, and 27. Inverter 13 has its input connected to node 12 and its output connected to node 14. Two-input NOR gate 15 has one input connected to node 16 and another input connected to the node 17 and has its output connected to node 18. Two-input NOR gate 19 has one input connected to node 20 and its other input connected to node 16 and has its output connected to node 21. NOR gate 22 has one input connected to node 14 and another input connected to node 18 and has its output connected to node 23. Two-input NOR gate 24 has one input connected to node 21 and another input connected to node 12 and has its output connected to node 25. Two-input AND gate 26 has one input connected to node 27 and another input connected to node 23. It should be noted that in an MOS implementation, for example, AND gate 26 and NOR gate 29 could be a combinational AND/NOR gate wherein the AND gate is not separable from the NOR sections. In such a circuit the AND function is implemented utilizing two series connected MOSFETs. Two-input AND gate 28 has one input connected to node 27 and one input connected to node 25. Two-input NOR gate 29 has one input connected to the output of AND gate 26 and the other input connected to node 30 and has its output connected to node 31. Two-input NOR gate 32 has one input connected to node 31 and another input connected to the output of AND gate 28 and has its output connected to node 30. Inverter 35 has its input connected to node 20 and its output connected to node 17. Three-input AND gate 35 has its inputs connected, respectively, to nodes 20, 31, and 12. Three-input AND gate 36 has its inputs connected respectively, to nodes 14, 30 and 17. Two-input NOR gate 37 has its inputs connected to the outputs, respectively, of AND gate 35 and AND gate 36, and has its output connected to node 38. Inverter 39 has its input connected to node 38 and its output connected to node 40.

FIGS. 2a–2d illustrate the MOS circuit inplementation of the logic elements in FIG. 1.

Figure 2A:
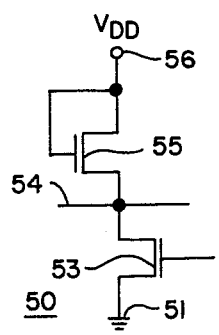
FIG. 2a is a circuit schematic diagram showing an MOS implementation of inverters which may be used in the embodiment of FIG. 1.

FIG. 2a is a schematic diagram of a typical MOS inverter and may be used to implement inverters 13, 35, and 39 in FIG. 1, and includes switching MOSFET 53 coupled between ground conductor 51 and output 54 and also includes load MOSFET 55 connected between $V_{DD}$ supply conductor 56 and output 54. The gate of MOSFET 53 is connected to inverter input 52.

Figure 2B:
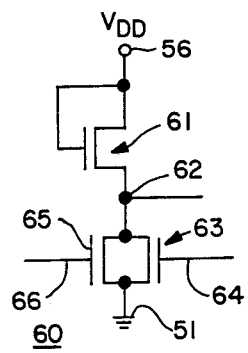
FIG. 2b is a MOS implementation of a NOR gate which may be used in the circuit of FIG. 1.

FIG. 2b is an MOS implementation of a two-input NOR gate and may be used to implement NOR gates 15, 19, 22, and 24 in FIG. 1. NOR gate 60 includes MOSFET 61 connected between $V_{DD}$ supply conductor 56 and output node 62 and further includes input MOSFET 65 and 63 coupled in parallel between ground conductor 51 and output node 62. The two inputs 66 and 64 are connected to the gates, respectively, of MOSFETs 65 and 63.

Figure 2C:
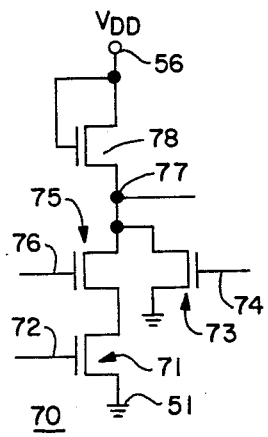
FIG. 2c is a MOS implementation of an AND/NOR gate which may be used in the circuit of FIG. 1.

FIG. 2c is a MOS implementation of the AND/NOR function and may be used to implement the combinational gates 28, 32 and 26, 29 in FIG. 1. Combinational AND/NOR gate 70 in FIG. 2c includes load MOSFET 78 connected between $V_{DD}$ conductor 56 and output node 77 and further includes MOSFET 73 connected between output node 77 and ground conductor 51 and having its gate electrode connected to an input of combinational AND/NOR gate 70. Combinational gate 7 also includes MOSFETs 75 and 71 connected in a series between output node 77 and ground conductor 5. MOSFETs 75 and 71 having their gate electrodes connected, respectively, to the other two inputs of combinational gate 70. The AND function of the combinational gate is accomplished by means of MOSFETs 7 and 71.

Figure 2D:
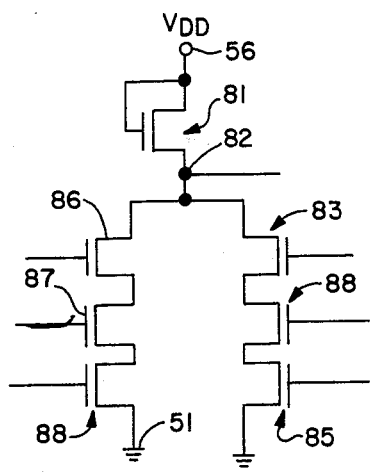
FIG. 2d is a MOS implementation of another AND/NOR gate which may be utilized in the embodiment of FIG. 1.

FIG. 2d is a MOSFET implementation of the AND NOR gate represented by AND gate 35 and 36 ar NOR gate 37 in FIG. 1. Combinational AND/NOR ga 80 includes load MOSFET 81 connected between $V_{DD}$ supply conductor 56 and output node 82 and further includes MOSFETs 86, 87, and 88 connected in series between output node 82 and ground conductor 51, each of the latter MOSFETs having the gate electrodes connected to a separate input. MOSFETs 86, 87 and 88 operate to provide one of the AND functions of combinational gate 80. MOSFETs 83, 84 and 85 are connected in series between output node 82 and ground conductor 51 to provide the other three input AND functions, the latter MOSFETs having their gate electrodes connected respectively, to the other three inputs of combinational gate 80.

Figure 3A:
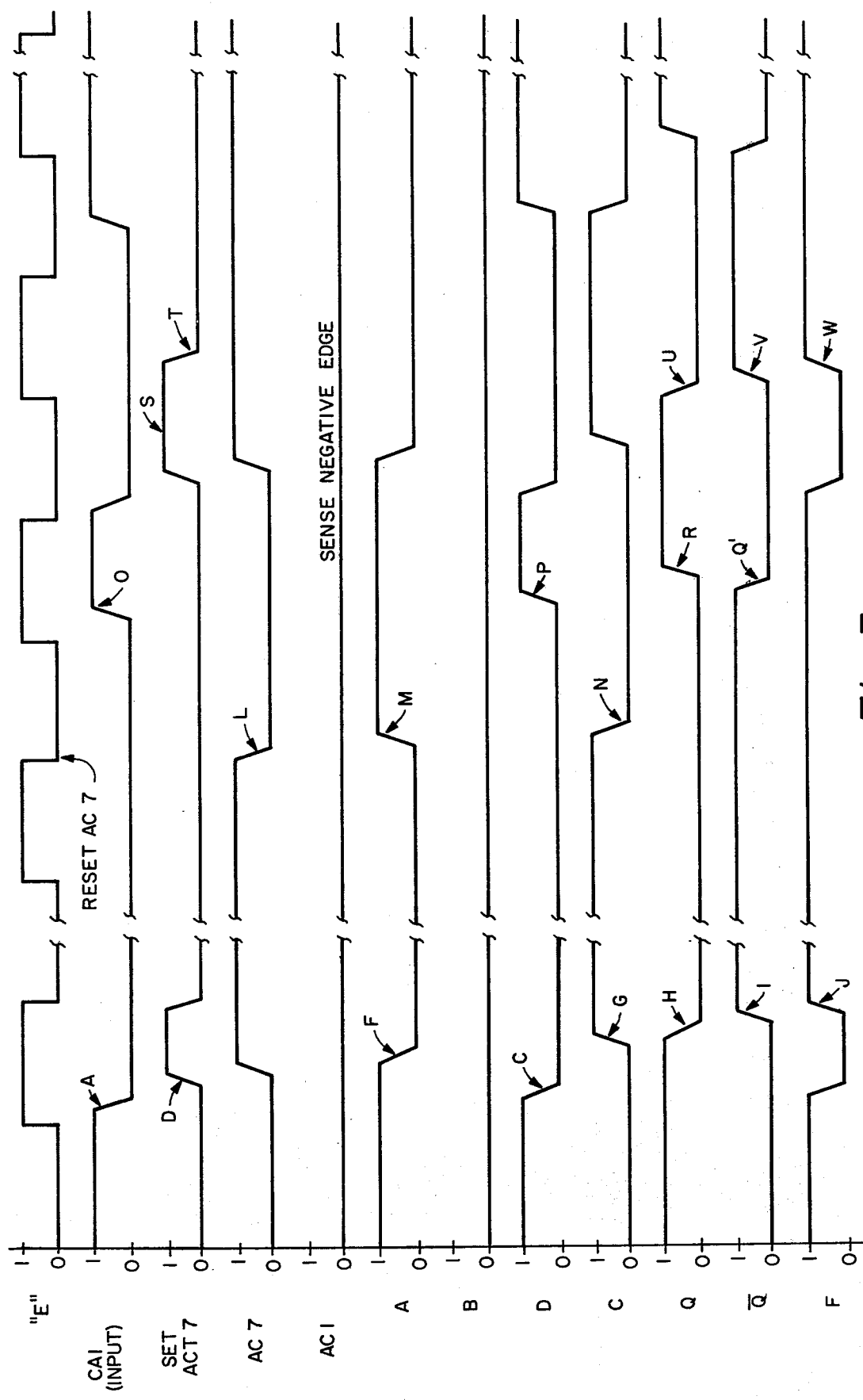
FIG. 3a is a partial timing diagram which is useful in describing the operation of the invention.
Figure 3B:
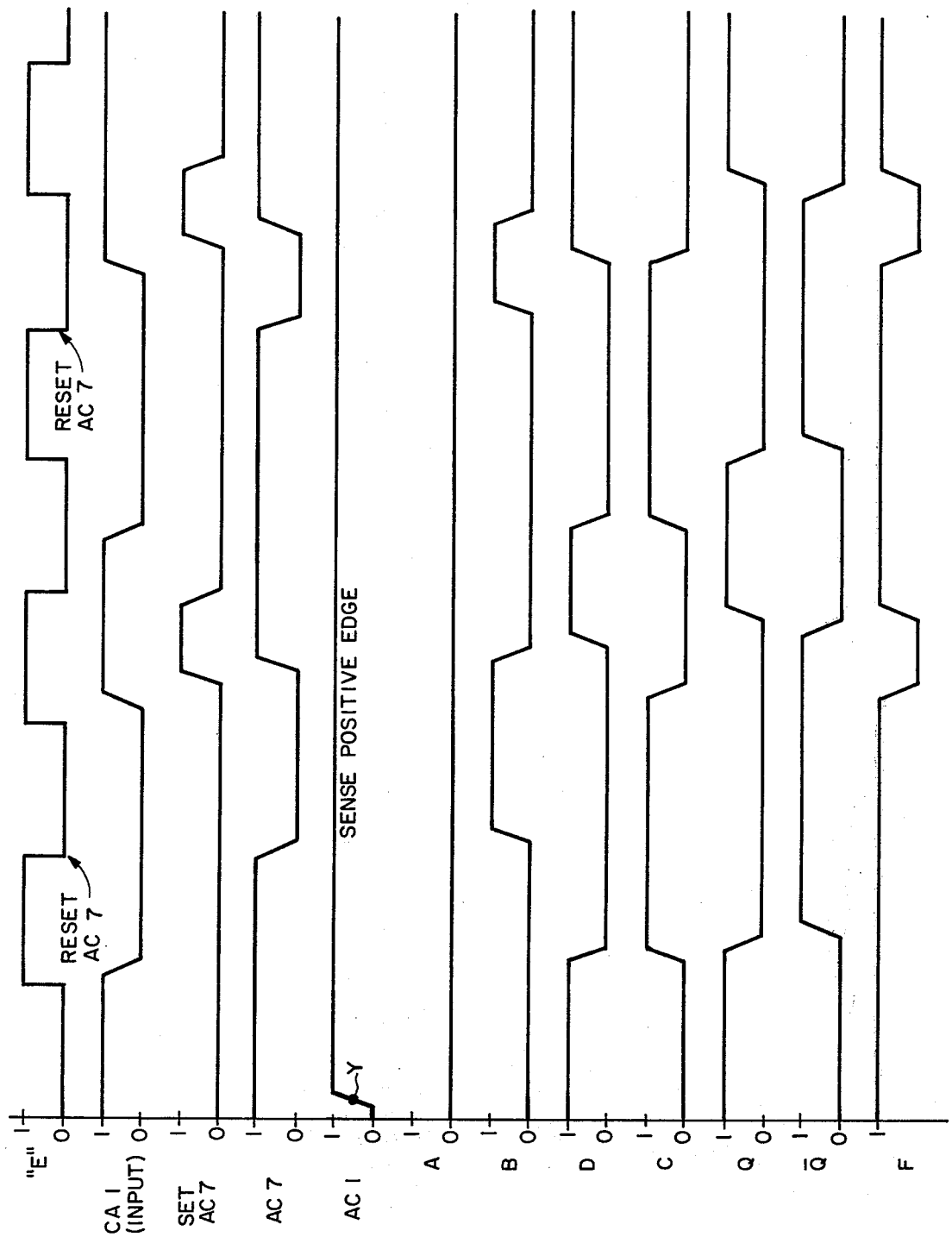
FIG. 3b is another partial timing diagram which is useful in describing the operation of the invention.

The operation of the edge sensing circuit of FIG. 1 is best described with relation to the timing diagram of FIGS. 3a and 3b. Input conductor 27 has a signal designated E(Enable) applied thereto. Conductor 20 has signal AC1 applied thereto. If AC1 is equal to a logical 1, circuit 10 senses a positive edge of input CA1 applied to conductor 12. If AC1 is a logical 0, sensing circuit 10 senses a negative edge of CA1. AC7 is, in one embodiment of the invention, the output of the register bit labeled 40 having a $\overline{Q}$ output connected to conductor 16 and a Set input connected to output Node 40. The signal on output node 40 sets a logical 1 in register bit 40, and the resulting signal on AC7 "acknowledges" that the edge (positive or negative, depending on the level of AC1 has been sensed.

Briefly, the operation of the circuit of FIG. 1 is that if E is at a logical 1 at the time that an edge of CA1 occurs that edge will be sensed. However, if E is equal to a logical 0 at the time that the edge of CA1 occurs, then the level rather than the edge CA1 is sensed. Referring to FIG. 3, it is seen that input CA1 undergoes negative transition A after E has already risen to a logical 1 level. In response to this node 14, which is $\overline{CA1}$, goes to a logical 1. AC1, during this time, is at a logical ,. and therefore $\overline{AC1}$, node 17, is at a logical 1. Therefore, the AC1, and the CA1 inputs of NAND gate 36 are at a logical 1. It is assumed that Q is at a logical 1 initially. Therefore, the result of transition A of CA1 is that NAND gate 36 is enabled, causing waveform F, node 38, to undergo transition B from a logical 1 to a logical 0. This causes signal "Set AC7" node 40 to undergo transition D from a logical 0 to a logical 1. This in turn sets register bit 40' to a logical 1, so that its output, AC7, undergoes transition E from a logical 0 to a logical 1. Since AC7 is connected to input NOR gates 15 and 19, waveform A undergoes transition F from a logical 1 to a logical 0, waveform B is already to logical 0 and remains there. In response to the above events, waveform D at node 23 undergoes transition C from a logical 1 to a logical 0 and waveform C goes from a logical 0 to a logical 1 during transition G, since both inputs of NOR gate 24, that is, waveforms A and CA1, are at a logical 0. Since AND gates 26 and 28 are enabled by the logical 1 of waveform E, the latch including NOR gates 29 and 32 is reset causing Q, node 30 to undergo transition H from a logical 1 to a logical 0 and waveform $\overline{Q}$, node 31, undergoes a corresponding logical transition I from a logical 0 to a logical 1.

This causes NAND gate 36 to be disabled (i.e., causes a logical 1 at its output), since Q is now at a logical 0, and therefore waveform F, node 38 undergoes positive transition J from a logical 0 to a logical 1, providing the desired signal which indicates that edge A of CA1 has been sensed.

It is assumed, for purposes of explanation, that register bit 40' is reset to a logical 0 during transition L, which causes node A to undergo transition M from a logical 0 to a logical 1. Node D then undergoes transition P in response to positive transition O of CA1, and the latch including NOR gate 29 and 32 is reset as indicated by transitions R and Q' of waveforms Q and $\overline{Q}$, respectively. Transition O' of CA1 is seen in FIG. 3 to occur when E is at a logical 0 as contrasted to the earlier negative transition A which occurred when E was a logical 1. Waveform Set AC7 undergoes a transition to level S in response to transition 0 as described above. Waveform AC7 goes from a logical 0 to a logical 1 in response to waveform Set AC7 as before. Since AC1 is still at a logical 0, nodes A, B, C, and D respond as previously described. However, since E is at a logical 0, NAND gates 26 and 28 are not enabled, and the signals of waveforms C and D cannot affect the latch including NOR gates 29 and 32 until transition T of waveform E, at which time waveform Q undergoes transition U from a logical 1 to a logical 0 and waveform $\overline{Q}$ undergoes transition V from a logical 0 to a logical 1. The transition W of waveform F can then be said to have sensed the "level" of CA1 rather than the "edge" thereof. In other words, for edge sensing, the edge to be sensed must occur while E is positive, otherwise "level sensing" is said to occur. The operation of circuit 10 for detecting the positive edge or level of CA1 is entirely similar to that described above, except that AC1 is at a logical 1 and NAND gate 35 is activated instead of NAND gate 36, the waveforms for this case are shown in FIG. 3B.

Note that in the description of the operation, the latch is initially in a "sensing mode"; transition L of waveform AC7 indicates when the latch is reset to its sensing mode.

The purpose of register bit 40' is to provide on line AC7 a signal which acknowledges whether or not an edge or level of CA1 has been sensed. For example, if a "dwarf" pulse occurs on node 12 (CA1), which does not propagate through the gating circuitry and succeeds in setting the latch including NOR gates 29 and 32, then AC7 remains low and permits another edge or pulse of CA1 to propagate through the gating circuitry and switch flip-flop 29, 32. This in effect is an added margin of noise immunity to the edge sensing circuit 10.

An edge sensing circuit could have been implemented without the use of enable signal E and the associated NAND gates 26 and 28. However, including these NAND gates provide additional noise immunity and also provide a option of sensing either and edge or level or CA1.

The following table indicates exemplary values in mils of the drawn channel length and channel widths of the MOSFET's in FIG. 2a–2d.

| MOSFET | CHANNEL WIDTH (Mils) | CHANNEL LENGTH (Mils) |
|---|---|---|
| 65 | 1.0 | .25 |
| 63 | 1.0 | 0.25 |
| 61 | 0.4 | 1.0 |
| 53 | 1.0 | 0.25 |
| 55 | 0.4 | 1.0 |
| 77 | 2.0 | 0.25 |
| 73 | 1.4 | 0.25 |
| 78 | 0.4 | 0.9 |
| 88 | 3.0 | 0.25 |
| 87 | 3.0 | 0.25 |

-continued

| MOSFET | CHANNEL WIDTH (Mils) | CHANNEL LENGTH (Mils) |
| --- | --- | --- |
| 86 | 3.0 | 0.25 |
| 85 | 3.0 | 0.25 |
| 84 | 3.0 | 0.25 |
| 83 | 3.0 | 0.25 |
| 81 | 0.4 | 0.6 |

While the invention has been described with reference to the preferred embodiment thereof, those skilled in the art will recognize that variations in form and placement of parts may be made to suit varying requirements within the scope of the present invention.

What is claimed is:

1. A transition sensing circuit coupled to an input conductor, an enable signal conductor, and a first control conductor and including first and second nodes, said transition sensing circuit comprising:
 gating circuit means coupled to said input conductor, said control conductor and said first and second nodes for providing a high logic level at one of said first or second nodes indicative of a positive signal transition at said input conductor conditional upon said first control conductor being at a first logic level, or providing a high level at the other of said first or second nodes indicative of a negative transition at said input conductor conditional upon said first control conductor being at a second logical level;
 flip-flop circuit means coupled to said enable conductor and to said first and second nodes of said gating circuit means responsive to signals at said first and second nodes for switching to a stored state indicative of sensing of a positive or a negative transition, said flip-flop circuit means having first and second outputs thereof; and
 output circuit means having an output and being coupled to said first and second outputs of said flip-flop circuit means for generating a signal at said output indicative of sensing of a transition of a signal at said input conductor.

2. The transition sensing circuit as recited in claim 1 further including a second control conductor coupled to said gating circuit means for enabling said gating circuit means to produce said high logic level.

3. The transition sensing circuit as recited in claim 2 wherein said gating circuit means includes:
 an inverter having an input coupled to said input conductor and an output coupled to a third node;
 a first NOR gate having one input coupled to said second control conductor and another input coupled to a fourth node and having an output coupled to a fifth node;
 a second NOR gate having an input coupled to said second control conductor and another input coupled to said first control conductor and an output coupled to a sixth node;
 a third NOR gate having one input coupled to said third node and another input coupled to said fifth node and an output coupled to said first node; and
 a fourth NOR gate having an input coupled to said sixth node, and another input coupled to said input conductor and an output coupled to said second node.

4. The transition sensing circuit as recited in claim 2 further including register circuit means having an input coupled to said output and having an output coupled to said second control conductor for generating a signal at said second control conductor verifying sensing of said transition.

5. The transition sensing circuit as recited in claim 4 wherein said flip-flop circuit means includes first and second AND/NOR gates having outputs coupled, respectively, to third and fourth nodes, said first AND/NOR gate having a NOR input coupled to said fourth node and having one AND input coupled to said enable signal conductor and another AND input coupled to said first node, said second AND/NOR gate having one NOR input coupled to said third node having one AND input coupled to said second node and another AND input coupled to said enable signal conductor.

6. The transition sensing circuit as recited in claim 5 wherein said output circuit includes an inverter having an output coupled to said second control conductor and further includes an AND/NOR gate having a NOR output coupled to an input of said inverter, a first NOR input coupled to a first AND output and a second NOR input coupled to a second AND output, a first AND input being coupled to said third node, a second AND input being coupled to said first control conductor, and a third AND input being coupled to said input conductor, said first, second, and third AND inputs being associated with the same AND gate as said first AND output, and further including a fourth AND input coupled to a fifth node, a fifth AND input coupled to said fourth node and a sixth AND input coupled to a conductor coupled to an output of a second inverter having its input coupled to said input conductor, said fourth, fifth, and sixth AND inputs being associated with the same AND gate as said second AND output.

7. The transition sensing circuit as recited in claim 6 further including a third inverter having its input connected to a sixth node and having an output coupled to said fifth node.

8. A transition sensing circuit connected to an input conductor, an enable conductor, a first control conductor, and a second control conductor comprising:
 a first inverter having an input connected to said input conductor and an output connected to a first node;
 a second inverter having an input connected to said first control conductor and an output connected to a second node;
 a first NOR gate having an input connected to said second control conductor, another input connected to said second node, and an output connected to a third node;
 a second NOR gate having an input connected to said second control conductor, and another input connected to said first control conductor and an output connected to a fourth node;
 a third NOR gate having an input connected to said first node, another input connected to said third node, and an output connected to a fifth node;
 a fourth NOR gate having an input connected to said fourth node, and another input connected to said input conductor and an output connected to a sixth node;
 and AND gate having an input connected to said enable conductor and another input connected to said fifth node;

a second AND gate having an input connected to said enable conductor and another input connected to said sixth node;

a fifth NOR gate having an input connected to an output of said first AND gate and another input connected to a seventh node and an output connected to an eighth node;

a sixth NOR gate having an input connected to said eighth node and another input connected to an output of said second AND gate and an output connected to said seventh node;

a third AND gate having an input connected to said first control conductor, another input connected to said eighth node, an another input connected to said input conductor;

a fourth AND gate having an input connected to said seventh node, another input connected to said first node, and another input connected to said second node; and a seventh NOR gate having one input connected to an output of said third AND gate another input connected to an output of said fourth AND gate and an output connected to a ninth node.

9. A transition sensing circuit as recited in claim 8 further including a third inverter having an input connected to said ninth node and an output connected to a 10 node.

10. The transition sensing circuit as recited in claim 9 further including a register circuit having an input connected to said 10 node and an output connected to said second control conductor.

* * * * *